United States Patent
Webster

(10) Patent No.: US 11,435,452 B2
(45) Date of Patent: Sep. 6, 2022

(54) PIXEL FOR TIME-OF-FLIGHT APPLICATIONS

(71) Applicant: OmniVision Technologies, Inc., Santa Clara, CA (US)

(72) Inventor: Eric A. G. Webster, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 876 days.

(21) Appl. No.: 16/267,162

(22) Filed: Feb. 4, 2019

(65) Prior Publication Data

US 2020/0249328 A1   Aug. 6, 2020

(51) Int. Cl.
| | |
|---|---|
| *G01S 7/4865* | (2020.01) |
| *G01S 7/481* | (2006.01) |
| *G01S 7/497* | (2006.01) |
| *G01S 17/42* | (2006.01) |
| *G01S 17/89* | (2020.01) |
| *G01S 17/00* | (2020.01) |

(52) U.S. Cl.
CPC .......... *G01S 7/4865* (2013.01); *G01S 7/481* (2013.01); *G01S 7/497* (2013.01); *G01S 17/42* (2013.01); *G01S 17/89* (2013.01)

(58) Field of Classification Search
CPC ........ G01S 7/4865; G01S 7/481; G01S 7/497; G01S 17/42; G01S 17/89; G01S 17/894; G01S 7/4914; H01L 27/14825; H01L 23/62; H01L 27/14609; H01L 27/14689; H01L 27/14887; H01L 27/14806; H01L 27/14868; H01L 27/14831
See application file for complete search history.

(56) References Cited

U.S. PATENT DOCUMENTS 4,649,430 A * 3/1987 Hynecek ........... H01L 27/14831
257/E27.154
4,656,503 A * 4/1987 Hynecek ........... H01L 27/14868
257/245

(Continued)

OTHER PUBLICATIONS

Stoppa, "Single-Photon Time-of-Flight Sensors for Spacecraft Navigation and Landing in CMOS Technologies," Section V.C.: Electronic Nanodevices and Technology Trends, NanoInnovation 2016, Rome Sep. 20-23, 2016, 32 pages.

(Continued)

*Primary Examiner* — Bernarr E Gregory
(74) *Attorney, Agent, or Firm* — Christensen O'Connor Johnson Kindness PLLC

(57) ABSTRACT

A time-of-flight (TOF) pixel includes a semiconductor material and a photogate disposed proximate to a frontside of the semiconductor material. The photogate is positioned to transfer charge in the semiconductor material toward the frontside in response to a voltage applied to the photogate. A floating diffusion is disposed in the semiconductor material proximate to the frontside of the semiconductor material, and one or more virtual phase implants is disposed in the semiconductor material proximate to the frontside of the semiconductor material. At least one of the one or more virtual phase implants extend laterally from under the photogate to the floating diffusion to transfer the charge to the floating diffusion.

25 Claims, 7 Drawing Sheets

(56) References Cited

U.S. PATENT DOCUMENTS

| | | | | |
|---|---|---|---|---|
| 5,355,165 A * | 10/1994 | Kosonocky | ....... | H01L 27/14806 |
| | | | | 348/E3.018 |
| 5,471,515 A * | 11/1995 | Fossum | ............. | H01L 27/14887 |
| | | | | 348/E3.018 |
| 5,625,210 A * | 4/1997 | Lee | ................... | H01L 27/14689 |
| | | | | 257/292 |
| 5,708,263 A * | 1/1998 | Wong | ................ | H01L 27/14609 |
| | | | | 250/214.1 |
| 6,414,341 B1 * | 7/2002 | Horiguchi | ............... | H01L 23/62 |
| | | | | 361/111 |

OTHER PUBLICATIONS

Perenzoni et al., "Figures of Merit for Indirect Time-of-Flight 3D Cameras: Definition and Experimental Evaluation," Remote Sensing, 2011, vol. 3, pp. 2461-2472.

Gersbach et al., "A Time-Resolved, Low-Noise Single-Photon Image Sensor Fabricated in Deep-Submicron CMOS Technology," IEEE Journal of Solid-State Circuits, vol. 47, No. 6, Jun. 2012, pp. 1394-1407.

Cova et al., "Chapter 4: Semiconductor-based detectors," pp. 1-56.

Stoppa et al., "A 50x30-pixel CMOS Sensor for TOF-based Real Time 3D Imaging," pp. 230-233.

Perenzoni et al., "Compact SPAD-Based Pixel Architectures for Time-Resolved Image Sensors," Sensors 2016, vol. 16, No. 745, 12 pages.

\* cited by examiner

PIXEL FOR TIME-OF-FLIGHT APPLICATIONS

TECHNICAL FIELD

This disclosure relates generally to optical sensors. In particular, examples of the present invention are related to time-of-flight sensors.

BACKGROUND INFORMATION

Interest in three dimension (3D) cameras is increasing as the popularity of 3D applications continues to grow in areas such as imaging, movies, games, computers, user interfaces, facial recognition, object recognition, augmented reality, and the like. A typical passive way to create 3D images is to use multiple cameras to capture stereo or multiple images. Using the stereo images, objects in the images can be triangulated to create the 3D image. One disadvantage with this triangulation technique is that it is difficult to create 3D images using small devices because there must be a minimum separation distance between each camera in order to create the three dimensional images. In addition, this technique is complex and therefore requires significant computer processing power in order to create the 3D images in real time.

For applications that require the acquisition of 3D images in real time, active depth imaging systems based on time-of-flight measurements are sometimes utilized. Time-of-flight cameras typically employ a light source that directs light at an object, a sensor that detects the light that is reflected from the object, and a processing unit that calculates the distance to the objected based on the round-trip time it takes for the light to travel to and from the object.

A continuing challenge with the acquisition of 3D images is balancing the desired performance parameters of the time-of-flight camera with the physical size and power constraints of the system.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
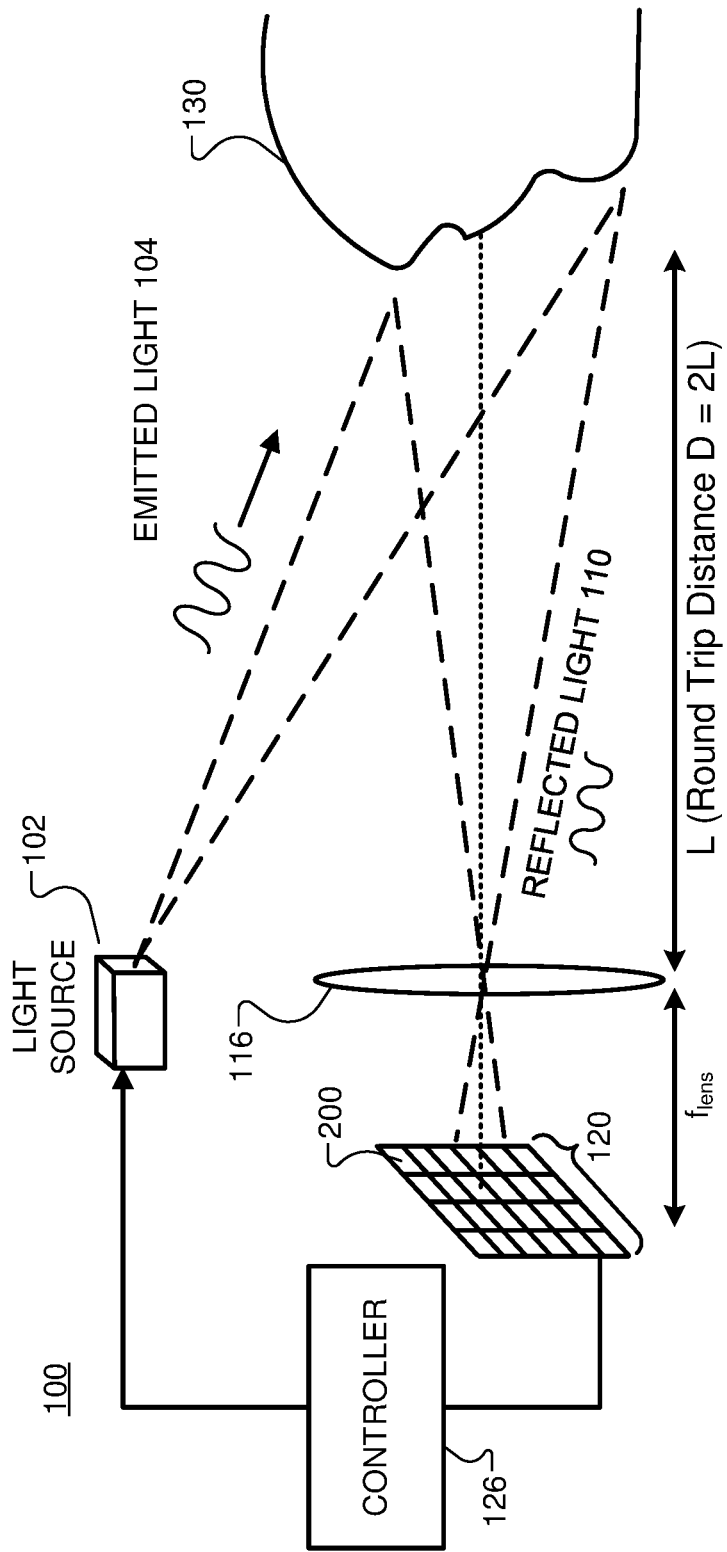
FIG. 1 is a diagram that shows one example of a time-of flight (TOF) system, in accordance with the teachings of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Examples of an apparatus, system, and method for a pixel for time-of-flight applications are described herein. In the following description, numerous specific details are set forth to provide a thorough understanding of the examples. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

The devices and methods disclosed herein solve the problem of how to achieve very fast charge transfer from the backside in backside illuminated (BSI) time-of-flight (TOF) pixels. Achieving fast transfer in the photodiode as part of a time-of-flight system may be beneficial for its total performance. Photodiode or photogate, as opposed to SPAD-based, TOF systems may operate in what is known as phase-detection mode where an output AC-modulated light source is used to illuminate the scene, and a synchronized photodiode with 2, 4, or N "taps" is used to receive the signal within time "bins". The amount of charge collected within each time bin is then used to reconstruct the return signal which is out of phase with the outgoing signal. This phase difference is then "demodulated" by circuitry to calculate the time difference between the signals and therefore calculate the range.

The accuracy of a TOF system is related to its frequency of operation. The higher the modulated frequency, the shorter the wavelength of the modulated light signal, and the shorter time bins which can be used. This then results in photo-generated charges being collected in shorter time bins allowing more accurate demodulation of the phase difference between outgoing and returning light waves. For example, systems may operate at 30 MHz and 300 MHz using 30 MHz to estimate the gross range and 300 MHz to calculate the precise range. One important distinction to note is between the wavelength of light used (which may be near infrared, such as 850/940 nm) and the frequency of AC-modulation of this light which, in some examples, may be in the approximately 30-300 MHz range.

It can be appreciated from device physics that if a 300 MHz signal is detected, then the electrons generated in the pixel may be collected and detected in the order of 1/300 MHz (~3 ns). If the pixel takes too long to respond to the input light, for example, 30 ns, then it will be difficult to demodulate a 300 MHz signal. Therefore, in TOF applications a very fast pixel transfer may be necessary.

Achieving fast transfer in a pixel is challenging and made even more difficult by using a BSI architecture, generally advantageous for higher quantum efficiency, which is in turn advantageous for using a lower illumination power in the application. This is because the most probable electron generation location for near-infrared (NIR) light used for TOF systems is actually at the backside surface because the light power poynting vector exponentially reduces from the backside surface. This means that in a BSI pixel, achieving fast transfer of electrons from the backside to a front side floating diffusion node may be necessary.

Figure 2A:
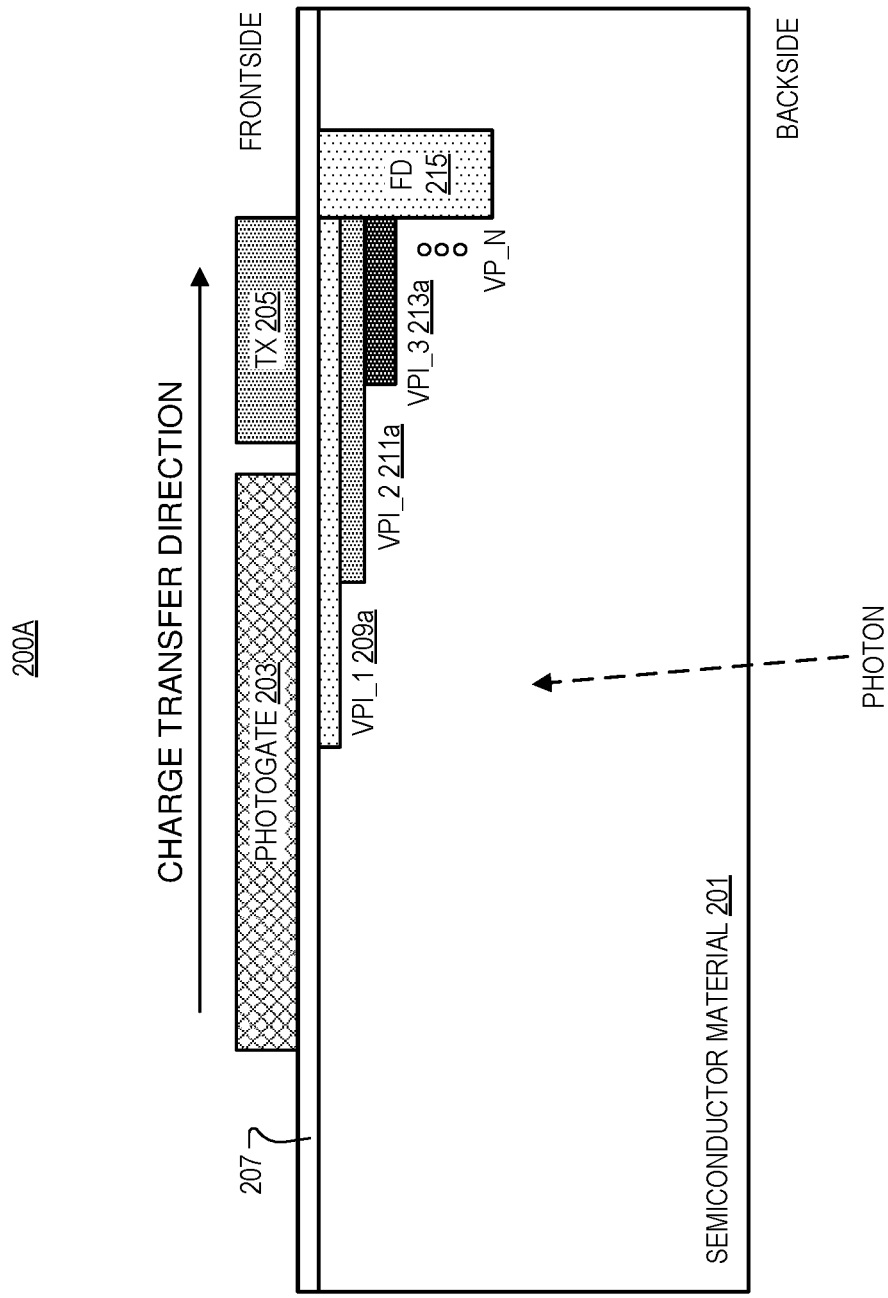
FIG. 2A illustrates an example cross sectional view of a pixel in the TOF system of FIG. 1, in accordance with the teachings of the present disclosure.

To solve this problem, example devices disclosed herein use the concept of introducing multiple virtual phase (e.g., n-type, although their polarity can be reversed to p-type) implants underneath photogate "fingers" to create a potential gradient, which creates an electric field that accelerates charge transfer (see e.g., FIG. 2A). The device architectures depicted herein substantially reduces the time for complete charge transfer of the optically generated signal from ~5 ns to ~2 ns. This enables the TOF system to operate at 300 MHz or more, rather than 200 MHz.

FIG. 1 is a diagram that shows one example of a time-of flight (TOF) system 100, in accordance with the teachings of the present disclosure. Time-of-flight system 100 includes a light source 102 (e.g., one or more photodiodes to emit one or more wavelengths of light), a lens 116, a plurality of pixels 120 (including a first pixel 200), and a controller 126 (which includes control circuitry, memory, etc.). The controller 126 is coupled to the light source 102, and the plurality of pixels 120 (including the first pixel 200). The plurality of pixels 120 is arranged in an array form and positioned at a focal length $f_{lens}$ from lens 116. As shown in the example, the light source 102 and lens 116 are positioned at a distance L from the object 130. It is appreciated that FIG. 1 is not illustrated to scale and that in one example the focal length $f_{lens}$ is substantially less than the distance L between lens 116 and object 130. Therefore, it is appreciated that for the purposes of this disclosure, the distance L and the distance L plus the focal length $f_{lens}$ are substantially equal for the purposes of time-of-flight measurements in accordance with the teachings of the present disclosure. As illustrated, the plurality of pixels 120, and the controller 126 are represented as separate components. However, it is appreciated that the plurality of pixels 120 and the controller 126 may all be integrated onto the same stacked chip sensor (see e.g., FIG. 2D). In other examples, the plurality of pixels 120, and the controller 126 may be integrated onto a non-stacked planar sensor.

The time-of-flight system 100 may be a 3D camera that calculates image depth information of a scene to be imaged (e.g., object 130) based on time-of-flight measurements with the plurality of pixels 120. Each pixel in the plurality of pixels 120 determines depth information for a corresponding portion of the object 130 such that a 3D image of the object 130 can be generated. Depth information is determined by measuring a round-trip time for light to propagate from the light source 102 to object 130 and back to time-of-flight system 100. As illustrated, the light source 102 (e.g., one or more vertical-cavity surface-emitting laser, or the like) is configured to emit light 104 to the object 130 over a distance L. The emitted light 104 is then reflected from the object 130 as the reflected light 110, some of which propagates towards the time-of-flight system 100 over a distance L and is incident upon the plurality of pixels 120 as image light. Each pixel (e.g., first pixel 200) in the plurality of pixels 120 includes a photodetector to detect the image light and convert the image light into an electric signal (e.g., image charge).

In some embodiments, distance may be measured using phase-shift-based time-of-flight. Generally this requires a continuous wave (e.g., square or sine) TOF system. High frequency enables more precise distance measurements, and systems may use multiple modulated frequencies to resolve range ambiguity. As described above, this may require fast transfer pixels with ~3 ns transfer in order to achieve 300 MHz operation.

To measure phase shift, a periodic light signal is produced. Given that the light has to cover distance two times, the distance L can be calculated using the phase shift $\theta_{distance}$ as:

$$L = \frac{c}{4\pi f}\theta_{distance}. \quad (1)$$

If a single frequency is used, unambiguous range is given by:

$$L_u = \frac{c}{2f} \quad (2)$$

where c is the speed of light which is approximately equal to $3\times10^8$ m/s, and f is frequency. Once the distance L is calculated, it may be used to determine depth information of the object 130.

In some examples, the time-of-flight sensor 100 is included in a handheld device (e.g., a mobile phone, a tablet, a camera, etc.) that has size and power constraints determined, at least in part, based on the size of the device. Alternatively, or in addition, the time-of-flight system 100 may have specific desired device parameters such as frame rate, depth resolution, lateral resolution, etc. In some examples, time-of-flight sensor 100 is included in a LiDAR system for automobile applications (e.g., parking sensor or proximity detection, etc.).

FIG. 2A illustrates an example cross sectional view of a pixel 200A included in the plurality of pixels 120 in the TOF system 100 of FIG. 1. The time-of-flight (TOF) pixel 200A includes a semiconductor material 201 (e.g., p$^{--}$ substrate, epitaxial silicon, or the like). The photogate 203 (e.g., N+polycrystalline or epitaxial silicon) is disposed proximate to a frontside (or front surface) of the semiconductor material 201, and positioned to transfer charge in semiconductor the material 201 toward the frontside of the semiconductor material 201 in response to a voltage applied to the photogate 203. The floating diffusion 215 is disposed in the semiconductor material 201 proximate to (e.g., implanted in) the frontside of the semiconductor material 201. One or more virtual phase implants 209a-213a are disposed in the semiconductor material 201 proximate to the frontside of the semiconductor material 201, and at least one of the one or more virtual phase implants 209a-211a extend laterally from under photogate 203 to the floating diffusion 215 to transfer the image charge corresponding to image and phase-shift information to the floating diffusion 215.

In the depicted example, one or more virtual phase implants 209a-213a includes a first virtual phase implant 209a, a second virtual phase implant 211a, and a third virtual phase implant 213a. The first virtual phase implant 209a is disposed (vertically) between the photogate 203 and the second virtual phase implant 211a, and the first virtual phase implant 209a has a lower dopant density than the second virtual phase implant 211a. As depicted, the second virtual phase implant 211a is disposed (vertically) between the first virtual phase implant 209a and the third virtual phase implant 213a, and the second virtual phase implant 211a has a lower dopant density than the third virtual phase implant 213a. As depicted, there may be any number of virtual phase implants (e.g., VPI_1-VPI_N) depending on the potential gradient needed and/or the pixel size to efficiently transfer charges into the floating diffusion 215. In the depicted example, the first virtual phase implant 209a is larger (e.g., both in cross sectional area and volume) than the second virtual phase implant 211a, and the second virtual phase implant 211a is larger than the third virtual phase implant 213a. One of skill in the art having the benefit of the present disclosure will appreciate that the virtual phase implants (e.g., VPI_1-VPI_N) may continue the stair-step pattern— where each virtual phase implant is implanted at different depth to achieve a lateral gradient of potential to accelerate electron transfer by electric field underneath the photogate 203.

For instance, the first virtual phase implant 209a extends from the floating diffusion 215 the furthest lateral distance under the photogate 203, with subsequent virtual phase implants extending a smaller lateral distance from the floating diffusion 215 towards the photogate 203—with progressively increasing dopant density (e.g., the first virtual phase implant 209a has lowest dopant density and the $N^{th}$ virtual phase implant has the highest dopant density) as depicted. In the illustrated example, the floating diffusion 215 has a higher dopant concentration than the one or more virtual phase implants 209a-213a so that the charge travels laterally from the one or more virtual phase implants 209a-213a into the floating diffusion 215. In the depicted example, the floating diffusion 215 is implanted into semiconductor material 201 deeper than the one or more virtual phase implants 209a-213a.

One of skill in the art having the benefit of the present disclosure will appreciate that the virtual phase implants may be implanted with dopant such as arsenic, boron, or other semiconductor dopants through the use of implant mask, and with different implant energy. Further it is worth noting that that the virtual phase implant doses (defining doping concentrations) may be low enough that they can be fully depleted by the application of gate and drain bias.

In the illustrated example, the transfer gate 205 is disposed proximate to the frontside of the semiconductor material 201, and laterally between the photogate 203 and the floating diffusion 215. The transfer gate 205 may either facilitate charge transfer to the floating diffusion 215, or inhibit charge transfer to the floating diffusion 215 depending on the voltage (e.g., positive or negative) applied to the transfer gate 205. In some examples, a voltage may be applied to the photogate 203 and the transfer gate 205 at the same time, and the voltage applied to the transfer gate 205 may be greater than, but of the same polarity as the voltage applied to the photogate 203 to further enhance speed of charge transfer to the floating diffusion 215. As shown, a gate oxide layer 207 (e.g., silicon oxide, hafnium oxide, or the like) is disposed between the semiconductor material 201 and the photogate 203, and between the semiconductor material 201 and the transfer gate 205.

Figure 2B:
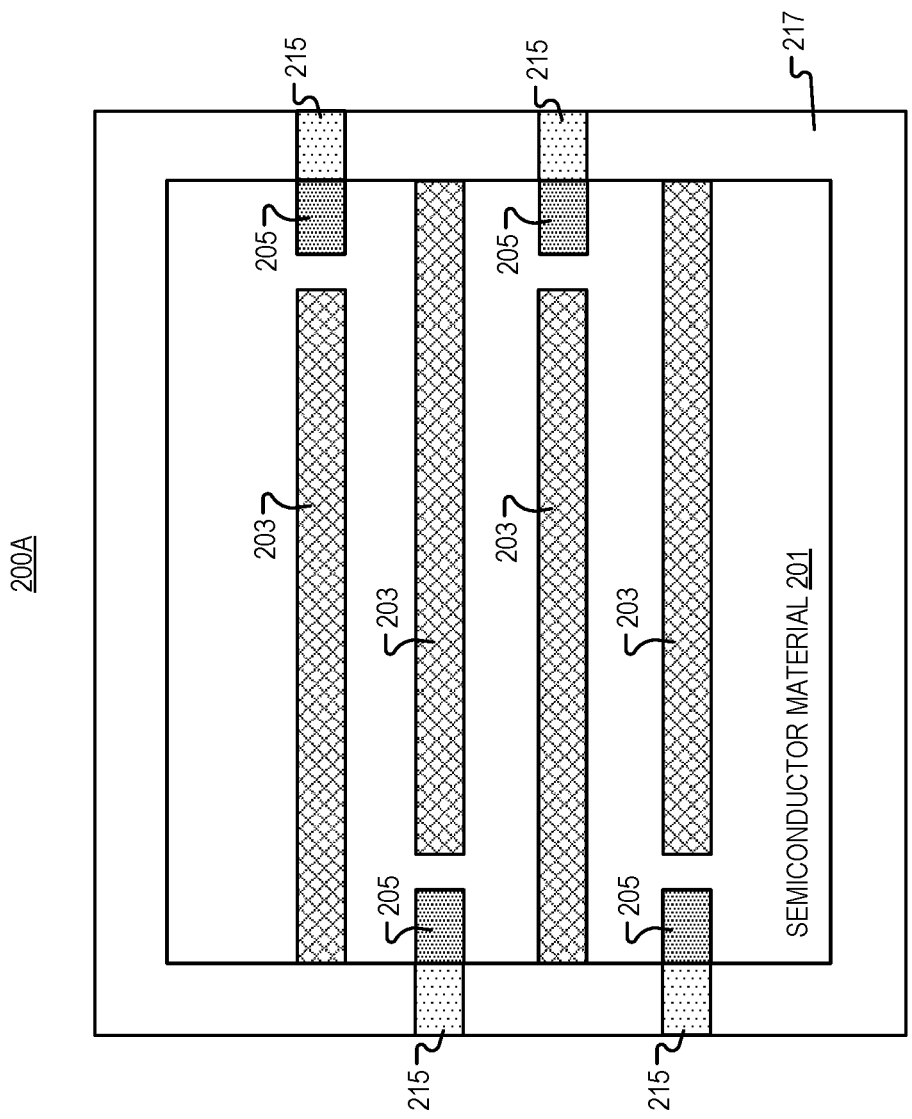
FIG. 2B illustrates an example top-down view of the pixel in FIG. 2A, in accordance with the teachings of the present disclosure.

FIG. 2B illustrates an example top-down view of pixel 200A from FIG. 2A, in accordance with the teachings of the present disclosure. It is appreciated that pixel 200A may be repeated many times to form an array (as depicted in FIG. 1).

In the depicted example, the pixel 200A is encircled, at least in part, by a doped well 217 disposed or implanted in the semiconductor material 201. As shown, the photogate 203, the transfer gate 205, the floating diffusion 215, and the one or more virtual phase implants (disposed underneath the photogate 203 and the transfer gate 205, so obscured from view in FIG. 2B) form a first digit (e.g., digit closest to the top of the page) that extends into a center region of doped well 217. The first digit is included in a plurality of digits (e.g., four depicted) that extend into the center region of the doped well 217. Thus, there are interdigitated electrodes that extend into the center region of doped well 217. As shown, the doped well 217 may form a continuous (e.g., annular) rectangle, and the floating diffusions 215 may be disposed, at least in part, within the doped well 217. It is appreciated that the doped well 217 may form shapes other than a square (e.g., hexagon, octagon, etc.), and different numbers (other than four—e.g., 1, 2, 3, 5, 6, 7, 8, etc.) of electrode structures/digits may extend into its center in accordance with the teachings of the present disclosure. While the digits here extend into the center region of the doped well 217 from opposing sides of the doped well 217, in other examples the digits may extend into the center of doped well from other locations. This "finger" photogate concept reduces capacitance (relative to one large photogate), enabling high frequency driving with reduced power consumption.

Figure 2C:
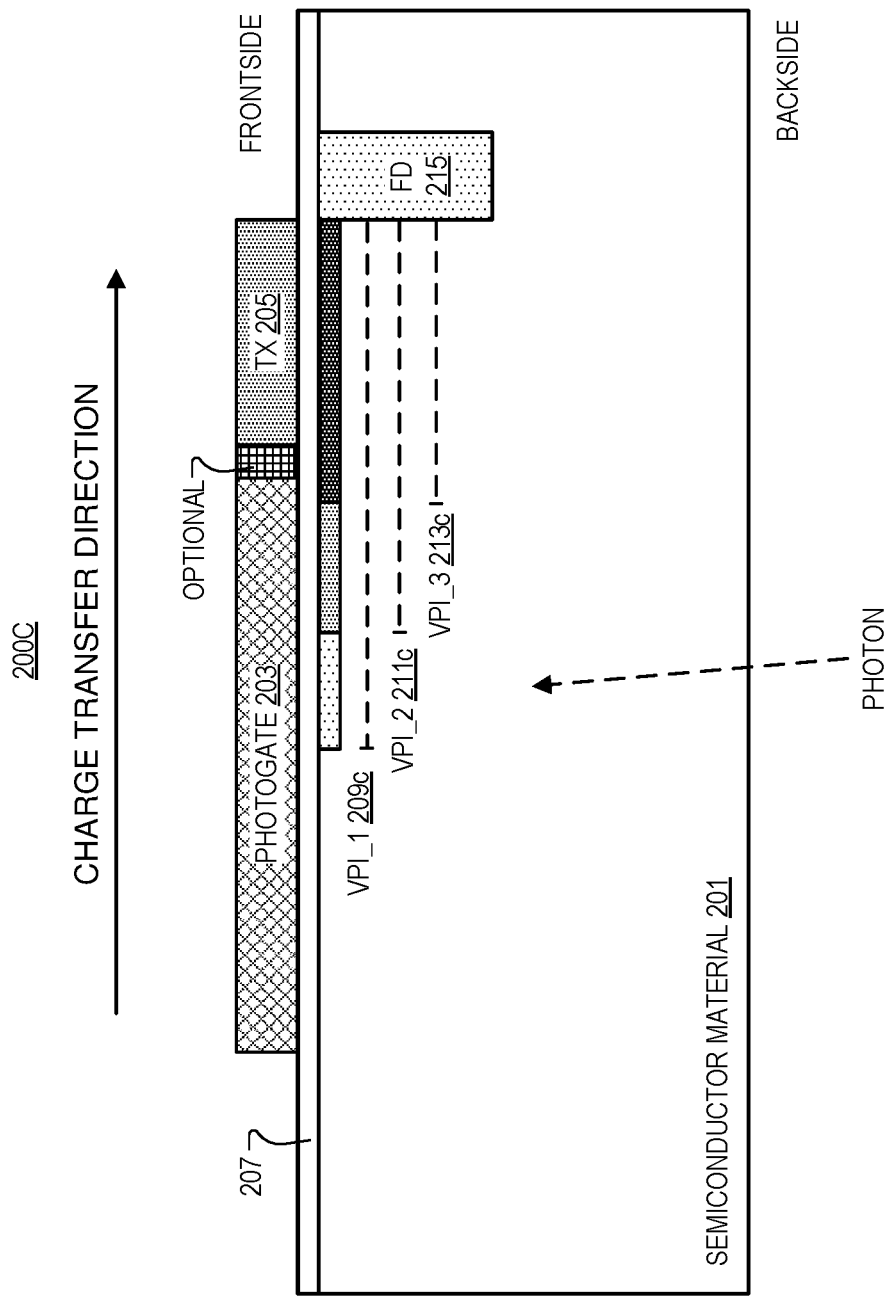
FIG. 2C illustrates another example cross sectional view of a pixel in the TOF system of FIG. 1, in accordance with the teachings of the present disclosure.

FIG. 2C illustrates another example cross sectional view of a pixel 200C which may be included in the TOF system of FIG. 1, in accordance with the teachings of the present disclosure. It is appreciated that FIG. 2C shares many of the same components with FIG. 2A and these components are numbered accordingly. In the depicted embodiment, the virtual phase implants 209c-213c are implanted at the same depth. More specifically, each virtual phase implant 209c-213c overlaps each preceding virtual phase implant (depicted with dashed lines) and adds doping concentration to the preceding virtual phase implant. For instance, the first virtual phase implant 209c is first disposed in the semiconductor material 201 and extends laterally from under the photogate 203 to the floating diffusion 215. The second virtual phase implant 211c is disposed in the semiconductor material 201 and extends laterally from under the photogate 203 to the floating diffusion 215 overlapping a portion of the first virtual phase implant 209c. The third virtual phase implant 213c is disposed in the semiconductor material 201 and extends laterally from under the photogate 203 to the floating diffusion 215. The third virtual phase implant 213c overlaps a portion of the first and second virtual phase implants 209c, 211c.

The first virtual phase implant 209c has a lower dopant density than the second virtual phase implant 211c, and as depicted, the second virtual phase implant 211c is disposed (horizontally) between the first virtual phase implant 209c and the third virtual phase implant 213c. The second virtual phase implant 211c has a lower dopant density than the third virtual phase implant 213c. It is appreciated that FIG. 2C may have the same top-down view presented in FIG. 2B.

In the depicted example, the photogate 203 and the transfer gate 205 may be (optionally) formed together creating one continuous layer of polysilicon on top of the gate oxide layer 207. This is depicted by the "optional" connector of polycrystalline silicon (or other suitable material).

Figure 2D:
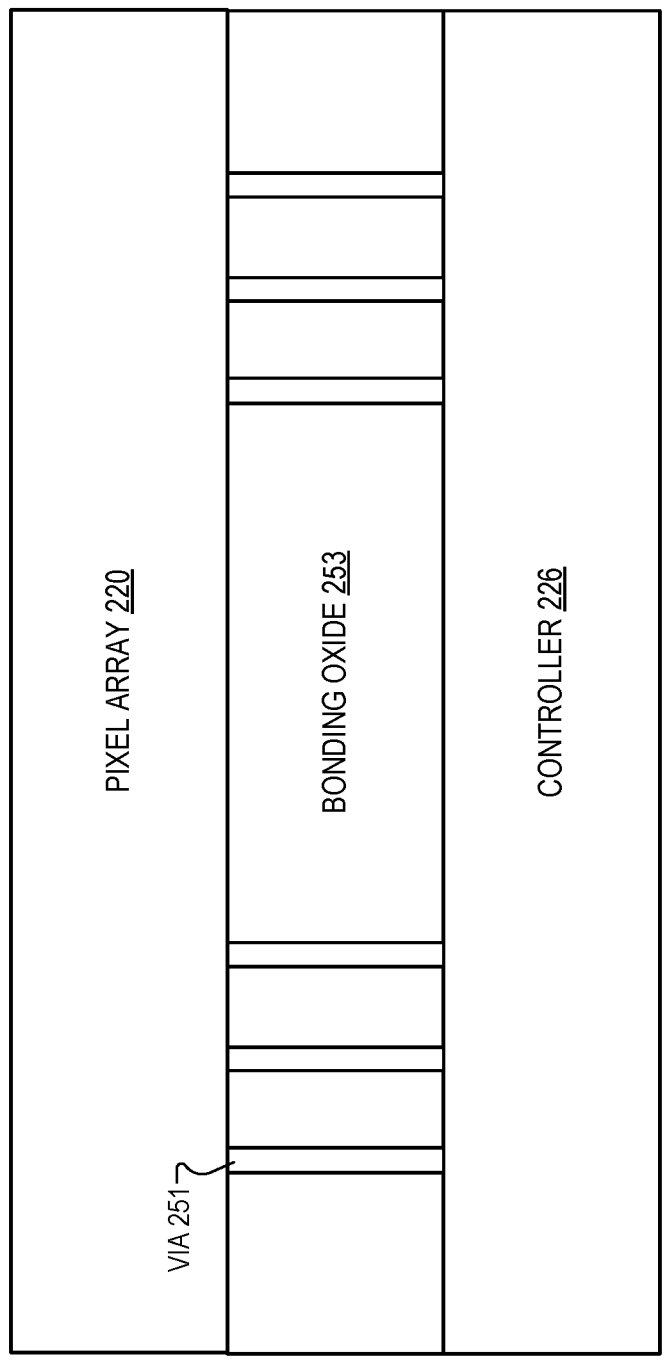
FIG. 2D illustrates an example stacked-chip sensor which may include the pixels of FIGS. 2A-2C, in accordance with the teachings of the present disclosure.

FIG. 2D illustrates an example stacked-chip sensor which may include the pixels of FIGS. 2A-2C, in accordance with the teachings of the present disclosure. As shown, stacked chip sensor includes a pixel array 220 (which may include the pixel architectures depicted in FIGS. 2A-2C). The pixel array 220 is coupled to a controller 226 which may receive data from pixel array 220 and perform operations (described elsewhere herein) with the data. The pixel array 220 and the controller 226 are electrically connected with metal vias 251 (e.g., copper, tungsten or the like) extending through a bonding oxide 253 (e.g., silicon oxide) that holds the two wafers together.

Figure 3:
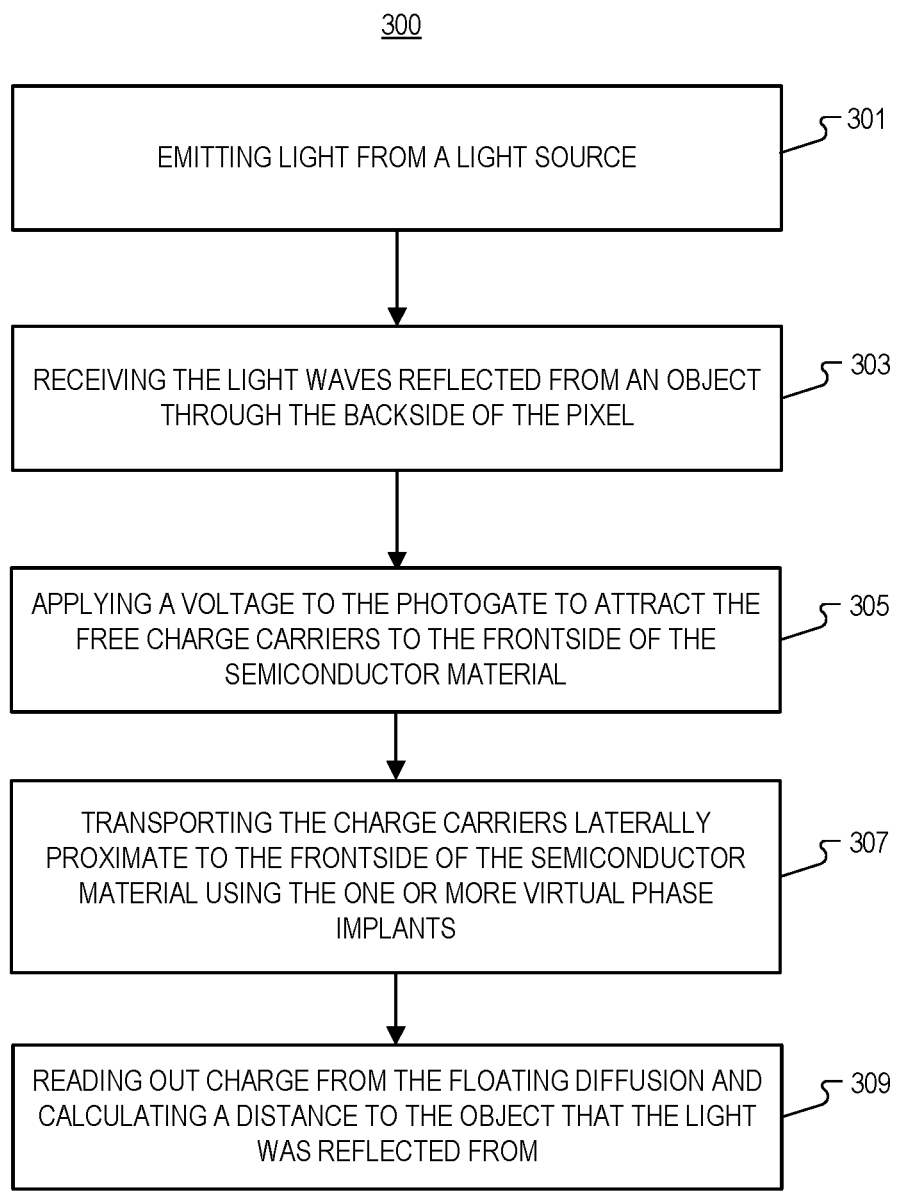
FIG. 3 illustrates an example method of calculating distance, in accordance with the teachings of the present disclosure.

FIG. 3 illustrates an example method 300 of calculating time-of-flight, in accordance with the teachings of the present disclosure. One of skill in the art will appreciate that blocks 301-309 in the method 300 may occur in any order and even in parallel. Moreover blocks may be added to, or removed from, method 300 in accordance with the teachings of the present disclosure.

Block 301 shows emitting wave-shaped light from a light source (e.g., one or more diodes). In some examples, the light is emitted with a laser emitter which may be visible (e.g., a red, green, or blue laser) or non-visible (e.g., infrared or ultraviolet laser). In other examples, non-laser diodes may be employed. In some examples, the control circuitry (e.g., ASIC, general purpose processor, or the like) is coupled to the light source to control the light source and emit waves at intervals that are pre-defined or determined during operation (e.g., depending on the ambient light conditions, the type and frequency of light pulses emitted from the light source may change).

Block 303 illustrates receiving the light waves reflected from an object through the backside of the pixel depicted in FIG. 2A. The reflected light waves may be out of phase from the light waves emitted from the light source. The reflected light may be absorbed by the semiconductor material and form free charge carriers (e.g., electrons/holes).

Block 305 shows applying a voltage to the photogate to attract the free charge carriers to the frontside of the semiconductor material. Without the voltage applied to the photogate, the charge carrier may be stuck in the bulk of the semiconductor material.

Block 307 illustrates transporting the charge carriers laterally proximate to the frontside of the semiconductor material using the one or more virtual phase implants (e.g., implants made using dopant such as arsenic, boron, or other semiconductor dopants). This is due to the lateral electric field created by the virtual phase implants underneath the photogate when voltage is applied to the photogate.

Block 309 shows reading out charge from the floating diffusion, and calculating a distance to the object that the light was reflected from. The charge in the floating diffusion may be amplified, and this signal may be used to determine the phase of the light. As shown above, the phase of the light may be used to determine the distance to the object with a high degree of accuracy.

In some embodiment, the method 300 of FIG. 3 can be implemented by a controller (e.g., the controller 126 of FIG. 1) of a TOF system. The controller may include a control circuitry and logic for controlling the operations of the light source and the plurality of pixels. The controller further includes a build-in memory (e.g., random access memory, erasable read only memory, or the like), and the memory may be programmed in such way that it causes the controller to perform the method described in FIG. 3. As stated above, the controller may be an application specific integrated circuit (ASIC—custom designed for the TOF system), a general purpose processor that can be programed in many different ways, or a combination of the two.

Figure 4:
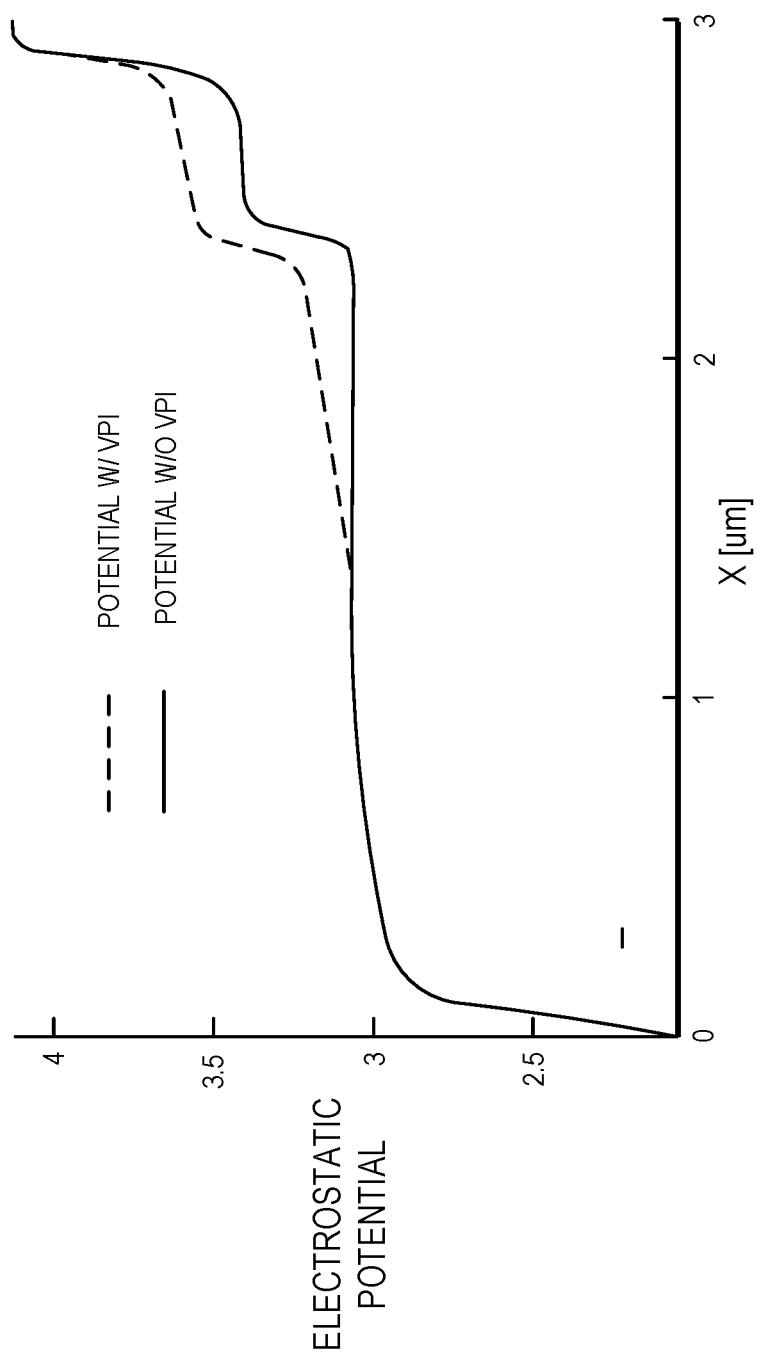
FIG. 4 illustrates electrostatic potential (from left to right) as a result of the virtual phase implant, in accordance with the teachings of the present disclosure.

FIG. 4 illustrates electrostatic potential (from left to right) as a result of the virtual phase implants in FIG. 2A, in accordance with the teachings of the present disclosure. FIG. 4 clearly illustrates the advantage of the virtual phase implant over a transfer transistor with a higher voltage than the photogate in creating a gradient in electrostatic potential from left to right. The virtual phase implants and masks are designed in such a way as to eliminate potential barriers which slow down charge transfer. In this way, charge transfer may occur via a drift mechanism at high speed. The result of this potential gradient induced by the virtual phase implants is demonstrated by comparison of charge transfer time, which is substantially improved as described above.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A time-of-flight (TOF) pixel, comprising:
a semiconductor material;
a photogate disposed proximate to a frontside of the semiconductor material and positioned to transfer charge in the semiconductor material toward the frontside in response to a voltage applied to the photogate;
a floating diffusion disposed in the semiconductor material proximate to the frontside of the semiconductor material; and
one or more virtual phase implants disposed in the semiconductor material proximate to the frontside of the semiconductor material, wherein at least one of the one or more virtual phase implants extend laterally from under the photogate to the floating diffusion to transfer the charge to the floating diffusion.

2. The TOF pixel of claim 1, wherein the one or more virtual phase implants includes a first virtual phase implant and a second virtual phase implant, wherein the first virtual phase implant has a lower dopant density than the second virtual phase implant.

3. The TOF pixel of claim 2, wherein the one or more virtual phase implants includes a third virtual phase implant, wherein the second virtual phase implant is disposed between the first virtual phase implant and the third virtual phase implant, and wherein the second virtual phase implant has a lower dopant density than the third virtual phase implant.

4. The TOF pixel of claim 3, wherein the first virtual phase implant is larger than the second virtual phase implant and the second virtual phase implant is larger than the third virtual phase implant.

5. The TOF pixel of claim 3, wherein the second virtual phase implant overlaps the first virtual phase implant, and wherein the first virtual phase implant and the second virtual phase implant extend into the semiconductor material a same distance.

6. The TOF pixel of claim 5, wherein the third virtual phase implant overlaps the first and the second virtual phase implants, and wherein the third virtual phase implant, extends into the semiconductor material the same distance as the first and the second virtual phase implants.

7. The TOF pixel of claim 1, further comprising a transfer gate disposed proximate to the frontside of the semiconductor material and laterally between the photogate and the floating diffusion.

8. The TOF pixel of claim 7, wherein the transfer gate and the photogate include a continuous polysilicon region.

9. The TOF pixel of claim 7, further comprising an oxide layer disposed between the semiconductor material and the photogate and the transfer gate.

10. The TOF pixel of claim 1, wherein the pixel is encircled by a doped well in the semiconductor material.

11. The TOF pixel of claim 10, and wherein the photogate, the floating diffusion, and the one or more virtual phase implants form a first digit that extends into a center region of the doped well.

12. The TOF pixel of claim 11, wherein the first digit is included in a plurality of digits that extend into the center region of the doped well.

13. The TOF pixel of claim 1, wherein the floating diffusion has a higher dopant concentration than the one or more virtual phase implants so that the charge travels laterally from the one or more virtual phase implants into the floating diffusion.

14. A time-of-flight (TOF) system, comprising:
a light source to emit light;
a pixel array including a pixel, comprising:
  a semiconductor material;
  a photogate disposed proximate to a frontside of the semiconductor material;
  a floating diffusion disposed in the semiconductor material proximate to the frontside; and
  one or more virtual phase implants disposed in the semiconductor material proximate to the frontside of the semiconductor material, wherein at least one of the one or more virtual phase implants extend laterally from the floating diffusion towards the photogate; and
a controller coupled to the light emitter and the pixel array, wherein the controller includes logic that when executed by the controller causes the TOF system to perform operations, including:
  emitting, with the light emitter, a sinusoidal waveform of the light;
  receiving the light reflected from an object with the pixel array, wherein the light is phase shifted; and
  in response to receiving the light, calculating a distance based on the phase shift.

15. The TOF system of claim 14, wherein the distance is calculated using a time-of-flight of the light.

16. The TOF system of claim 14, wherein the one or more virtual phase implants includes a first virtual phase implant and a second virtual phase implant, wherein the first virtual phase implant is disposed between the photogate and the second virtual phase implant and has a lower dopant density than the second virtual phase implant.

17. The TOF system of claim 16, wherein the one or more virtual phase implants includes a third virtual phase implant, wherein the second virtual phase implant is disposed between the first virtual phase implant and the third virtual phase implant, and wherein the second virtual phase implant has a lower dopant density than the third virtual phase implant.

18. The TOF system of claim 14, wherein the one or more virtual phase implants includes a first virtual phase implant and a second virtual phase implant, and wherein the second virtual phase implant overlaps the first virtual phase implant, and wherein the first virtual phase implant and the second virtual phase implant extend into the semiconductor material a same distance.

19. The TOF system of claim 18, wherein the one or more virtual phase implants includes a third virtual phase implant, and wherein the third virtual phase implant overlaps the first and the second virtual phase implants, and wherein the third virtual phase implant extends into the semiconductor material the same distance as the first virtual phase implant and the second virtual phase implant.

20. The TOF system of claim 18, wherein the first virtual phase implant is larger than the second virtual phase implant and the second virtual phase implant is larger than the third virtual phase implant.

21. The TOF system of claim 14, the pixel further comprising a transfer gate disposed proximate to the frontside of the semiconductor material and laterally between the photogate and the floating diffusion.

22. The TOF system of claim 14, wherein the pixel is encircled at least in part by a doped well disposed in the semiconductor material.

23. The TOF system of claim 22, wherein the photogate, the floating diffusion, and the one or more virtual phase implants form a first digit that extends into a center region of the doped well.

24. The TOF system of claim 23, wherein the first digit is included in a plurality of digits that extend into the center region of the doped well.

25. The TOF system of claim 24, wherein the plurality of digits are interdigitated, and wherein the floating diffusion is disposed in the doped well.

* * * * *